(12) United States Patent
Luo et al.

(10) Patent No.: US 11,563,335 B2
(45) Date of Patent: Jan. 24, 2023

(54) SYSTEMS AND METHODS FOR LOW CURRENT DETECTION

(71) Applicant: ON-BRIGHT ELECTRONICS (SHANGHAI) CO., LTD., Shanghai (CN)

(72) Inventors: Qiang Luo, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 328 days.

(21) Appl. No.: 16/803,823

(22) Filed: Feb. 27, 2020

(65) Prior Publication Data
US 2021/0226470 A1    Jul. 22, 2021

(30) Foreign Application Priority Data

Jan. 16, 2020    (CN) .......................... 202010056938.0

(51) Int. Cl.
*H02J 7/00*    (2006.01)
*H02M 3/158*    (2006.01)
(Continued)

(52) U.S. Cl.
CPC .... *H02J 7/00714* (2020.01); *G01R 19/16519* (2013.01); *H02J 7/0013* (2013.01);
(Continued)

(58) Field of Classification Search
CPC ............... H02J 7/00714; H02J 7/00712; H02J 7/00447; H02J 7/00; H02M 1/083; H02M 3/158; H02M 1/0035; G01R 19/165
See application file for complete search history.

(56) References Cited

U.S. PATENT DOCUMENTS

2008/0246455 A1   10/2008  Chu et al.
2009/0133942 A1*  5/2009   Iisaka ..................... H02J 50/80
                                                    320/108
(Continued)

FOREIGN PATENT DOCUMENTS

CN    103887980 A      6/2014
TW    201815045        4/2018
(Continued)

OTHER PUBLICATIONS

Taiwan Patent Office, Notice of Allowance dated Oct. 12, 2020, in Application No. 109107498.
(Continued)

*Primary Examiner* — Richard Isla
*Assistant Examiner* — Sadia Kousar
(74) *Attorney, Agent, or Firm* — Faegre Drinker Biddle & Reath LLP

(57) ABSTRACT

System and method for charging or discharging one or more batteries. For example, a battery management system for charging or discharging one or more batteries includes: a first transistor including a first transistor terminal, a second transistor terminal, and a third transistor terminal, the second transistor terminal being configured to receive a first drive signal; a second transistor including a fourth transistor terminal, a fifth transistor terminal, and a sixth transistor terminal, the fifth transistor terminal being configured to receive a second drive signal; a burst mode detector configured to receive the first drive signal and generate a burst-mode detection signal based at least in part on the first drive signal; and a drive signal generator configured to receive the burst-mode detection signal and generate the first drive signal and the second drive signal based at least in part on the burst-mode detection signal.

22 Claims, 7 Drawing Sheets

(51) Int. Cl.
*H02M 1/08* (2006.01)
*G01R 19/165* (2006.01)
*H02M 1/00* (2006.01)

(52) U.S. Cl.
CPC .......... *H02J 7/0047* (2013.01); *H02M 1/083* (2013.01); *H02M 3/158* (2013.01); *H02J 2207/20* (2020.01); *H02M 1/0035* (2021.05)

(56) References Cited

U.S. PATENT DOCUMENTS

| | | | |
|---|---|---|---|
| 2014/0097814 A1* | 4/2014 | Brewster | H02M 3/156 323/282 |
| 2014/0347078 A1 | 11/2014 | Qin | |
| 2016/0276931 A1* | 9/2016 | Trichy | H02M 3/158 |
| 2018/0331564 A1* | 11/2018 | Song | H02J 7/02 |
| 2019/0181759 A1* | 6/2019 | Sharma | H02M 1/08 |

FOREIGN PATENT DOCUMENTS

| | | |
|---|---|---|
| TW | I-643426 | 12/2018 |
| WO | WO 2017/124115 | 7/2017 |
| WO | WO 2018/208434 | 11/2018 |

OTHER PUBLICATIONS

China Patent Office, Notice of Allowance dated Nov. 4, 2022, in Application No. 202010056938.0.

\* cited by examiner

US 11,563,335 B2

SYSTEMS AND METHODS FOR LOW CURRENT DETECTION

1. CROSS-REFERENCES TO RELATED APPLICATIONS

This application claims priority to Chinese Patent Application No. 202010056938.0, filed Jan. 16, 2020, incorporated by reference herein for all purposes.

2. BACKGROUND OF THE INVENTION

Certain embodiments of the present invention are directed to integrated circuits. More particularly, some embodiments of the invention provide systems and methods for low current detection. Merely by way of example, certain embodiments of the invention have been applied to charging and/or discharging of batteries. But it would be recognized that the invention has a much broader range of applicability.

A battery management system is widely used for managing one or more lithium-ion batteries. Often, the battery management system needs to detect the charging current or the discharging current of a lithium-ion battery. When the charging current falls below a predetermined threshold (e.g., an exit threshold current), the battery management system usually determines the battery to be fully charged, and when the discharging current falls below the predetermined threshold (e.g., the exit threshold current), the battery management system often determines the load (e.g., a mobile phone) to be full or the load (e.g., a mobile phone) to be pulled out.

In some examples, for battery charging, when the battery is full, the charging current reduces to a very small magnitude (e.g., zero) that is below the predetermined threshold (e.g., the exit threshold current). The battery management system (e.g., a battery management chip) needs to detect the battery being full and then terminate the charging process in order to protect the battery from certain adverse effects of excessive charging. In certain examples, for battery discharging, when the load is full or the load is pulled out, the discharging current reduces to a very small magnitude (e.g., zero) that is below the predetermined threshold (e.g., the exit threshold current). The battery management system (e.g., a battery management chip) needs to detect the load being full or pulled out and then terminate the discharging process in order to prevent the battery management system itself from further consuming the battery power. To detect whether the charging current or the discharging current drops below the predetermined threshold (e.g., the exit threshold current), an external sense resistor and/or an internal sense field effect transistor (FET) often are used.

FIG. 1 is a simplified diagram showing a conventional battery charging system. The battery charging system 100 includes a battery management system 110, an inductor 120, a resistor 130, a battery 140, a power supply 190. The battery management system 110 (e.g., a chip) includes terminals 150, 152, 154, 156 and 158 (e.g., pins). Additionally, the battery management system 110 (e.g., a chip) includes a voltage sensing circuit 112, a logic controller and gate driver 114, and transistors 116 and 118. The logic controller and gate driver 214 generates the gate drive signals 162 and 164, which are received by the transistors 116 and 118 respectively. The power supply 190 provides an input voltage to the terminal 154, and the battery 140 (e.g., a lithium-ion battery) is charged between the terminals 156 and 158 through at least the inductor 120 and the resistor 130. For example, each of the transistors 116 and 118 includes a drain terminal, a gate terminal, and a source terminal. As an example, the battery 140 includes a terminal 142 connected to the inductor 120, and the battery 140 also includes a terminal 144 connected to the terminal 158 and biased to a ground voltage.

As shown in FIG. 1, the resistor 130 is external to the battery management system 110 (e.g., a chip). To reduce the power consumption of the resistor 130, the resistance value of the resistor 130 usually is set to be very small, in the range of 10 mat. As an example, the exit threshold current often is set in the range of 50 mA to 100 mA, so the voltage sensing circuit 112 needs to detect a voltage that is less than 1 mV in magnitude. In order to accurately detect such a small voltage, the voltage sensing circuit 112 usually adopts a special structure with chopping mechanism, and/or uses electronic components with large sizes. For example, each of the transistors 116 and 118 is an NMOS transistor. As an example, the drain terminal of the transistor 116 receives an input voltage 192 from the power supply 190 through the terminal 154.

FIG. 2 is a simplified diagram showing another conventional battery charging system. The battery charging system 200 includes a battery management system 210, an inductor 220, a battery 240, and a power supply 290. The battery management system 210 (e.g., a chip) includes terminals 254, 256 and 258 (e.g., pins). Additionally, the battery management system 210 (e.g., a chip) includes a current sensing circuit 212, a logic controller and gate driver 214, and transistors 116, 118 and 260. The logic controller and gate driver 214 generates a gate drive signal 262, which is received by the transistors 260 and 216, and the logic controller and gate driver 214 also generates a gate drive signal 264, which is received by the transistor 218. The power supply 290 provides an input voltage to the terminal 254, and the battery 240 (e.g., a lithium-ion battery) is charged between the terminals 256 and 258 through at least the inductor 220. For example, each of the transistors 216 and 218 includes a drain terminal, a gate terminal, and a source terminal. As an example, the battery 240 includes a terminal 242 connected to the inductor 220, and the battery 240 also includes a terminal 244 connected to the terminal 258 and biased to a ground voltage.

As shown in FIG. 2, the transistor 260 (e.g., a field-effect transistor) serves as a sense transistor, external to the battery management system 210 (e.g., a chip). The current flowing through the transistor 260 is equal to the current flowing through the transistor 216 divided by N, where N is a positive integer. Often, N is selected to be a large integer (e.g., an integer ranging from 1,000 to 10,000) in order to make the current flowing through the transistor 260 small under the full load condition when the current flowing though the transistor 216 is large. The current flowing through the transistor 260 is detected by the current sensing circuit 212, but the current detection accuracy of the battery charging system 200 is limited.

Hence it is highly desirable to improve the techniques related to detecting a charging current and/or a discharging current of a lithium-ion battery.

3. BRIEF SUMMARY OF THE INVENTION

Certain embodiments of the present invention are directed to integrated circuits. More particularly, some embodiments of the invention provide systems and methods for low current detection. Merely by way of example, certain embodiments of the invention have been applied to charging and/or discharging of batteries. But it would be recognized that the invention has a much broader range of applicability.

According to some embodiments, a battery management system for charging or discharging one or more batteries includes: a first transistor including a first transistor terminal, a second transistor terminal, and a third transistor terminal, the second transistor terminal being configured to receive a first drive signal; a second transistor including a fourth transistor terminal, a fifth transistor terminal, and a sixth transistor terminal, the fifth transistor terminal being configured to receive a second drive signal; a burst mode detector configured to receive the first drive signal and generate a burst-mode detection signal based at least in part on the first drive signal; and a drive signal generator configured to receive the burst-mode detection signal and generate the first drive signal and the second drive signal based at least in part on the burst-mode detection signal; wherein: the fourth transistor terminal of the second transistor is connected to the third transistor terminal of the first transistor; and the third transistor terminal and the fourth transistor terminal are coupled to a first battery terminal of one or more batteries through an inductor, the one or more batteries further including a second battery terminal; wherein the burst mode detector is further configured to: determine a first number of one or more continuous cycles of the first drive signal, during each cycle of the one or more continuous cycles the first drive signal switching between a first logic level and a second logic level; determine a second number of one or more skipped cycles of the first drive signal, during each cycle of the one or more skipped cycles the first drive signal remaining at the first logic level; determine whether an average magnitude of an inductor current provided by the third transistor terminal and the fourth transistor terminal to the inductor or received by the third transistor terminal and the fourth transistor terminal from the inductor is smaller than a predetermined current threshold based at least in part on the first number of the one or more continuous cycles and the second number of the one or more skipped cycles; and if the average magnitude of the inductor current is smaller than the predetermined current threshold, generate the burst-mode detection signal to cause the drive signal generator to stop first modulation of the first drive signal and stop second modulation of the second drive signal; wherein the drive signal generator is further configured to, if the average magnitude of the inductor current is smaller than the predetermined current threshold, in response to the burst-mode detection signal, stop the first modulation of the first drive signal and the second modulation of the second drive signal so that the first transistor and the second transistor remain turned off.

According to certain embodiments, a battery management system for charging or discharging one or more batteries includes: a first transistor including a first transistor terminal, a second transistor terminal, and a third transistor terminal, the second transistor terminal being configured to receive a first drive signal; a burst mode detector configured to receive the first drive signal and generate a burst-mode detection signal based at least in part on the first drive signal; and a drive signal generator configured to receive the burst-mode detection signal and generate the first drive signal based at least in part on the burst-mode detection signal; wherein the burst mode detector is further configured to: determine a first number of one or more continuous cycles, during each cycle of the one or more continuous cycles the first drive signal switching between a first logic level and a second logic level; determine a second number of one or more skipped cycles, during each cycle of the one or more skipped cycles the first drive signal remaining at the first logic level; and if the first number being smaller than the predetermined continuous threshold and the second number being larger than the predetermined skipping threshold are both satisfied for a time duration that is larger than a predetermined time threshold, generate the burst-mode detection signal to cause the drive signal generator to stop first modulation of the first drive signal; wherein the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the first modulation of the first drive signal so that the first transistor remains turned off.

According to some embodiments, a method for charging or discharging one or more batteries includes: receiving the first drive signal; processing information associated with the first drive signal; generating a burst-mode detection signal based at least in part on the first drive signal; receiving the burst-mode detection signal; processing information associated with the burst-mode detection signal; and generating a first drive signal and a second drive signal based at least in part on the burst-mode detection signal; wherein the processing information associated with the first drive signal includes: determining a first number of one or more continuous cycles of the first drive signal, during each cycle of the one or more continuous cycles the first drive signal switching between a first logic level and a second logic level; determining a second number of one or more skipped cycles of the first drive signal, during each cycle of the one or more skipped cycles the first drive signal remaining at the first logic level; and determining whether an average magnitude of an inductor current provided by the third transistor terminal and the fourth transistor terminal to the inductor or received by the third transistor terminal and the fourth transistor terminal from the inductor is smaller than a predetermined current threshold based at least in part on the first number of the one or more continuous cycles and the second number of the one or more skipped cycles; wherein the generating a burst-mode detection signal based at least in part on the first drive signal includes: if the average magnitude of the inductor current is smaller than the predetermined current threshold, generating the burst-mode detection signal to stop first modulation of the first drive signal and stop second modulation of the second drive signal; wherein the generating a first drive signal and a second drive signal based at least in part on the burst-mode detection signal includes: if the average magnitude of the inductor current is smaller than the predetermined current threshold, in response to the burst-mode detection signal, stopping the first modulation of the first drive signal and the second modulation of the second drive signal so that the first transistor and the second transistor remain turned off.

According to certain embodiments, a method for charging or discharging one or more batteries includes: receiving a first drive signal; processing information associated with the first drive signal; generating a burst-mode detection signal based at least in part on the first drive signal; receiving the burst-mode detection signal; processing information associate with the burst-mode detection signal; and generating the first drive signal based at least in part on the burst-mode detection signal; wherein the processing information associated with the first drive signal includes: determining a first number of one or more continuous cycles, during each cycle of the one or more continuous cycles the first drive signal switching between a first logic level and a second logic level; and determining a second number of one or more skipped cycles, during each cycle of the one or more skipped cycles the first drive signal remaining at the first logic level; wherein the generating a burst-mode detection signal based at least in part on the first drive signal includes: if the first number being smaller than the predetermined continuous threshold and the second number being larger than the predetermined skipping threshold are both satisfied for a time duration that is larger than a predetermined time threshold, generating the burst-mode detection signal to stop first modulation of the first drive signal; wherein the generating the first drive signal based at least in part on the burst-mode detection signal includes: if the first number being smaller than the predetermined continuous threshold and the second number being larger than the predetermined skipping threshold are both satisfied for the time duration that is larger than the predetermined time threshold, in response to the burst-mode detection signal, stopping the first modulation of the first drive signal.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to integrated circuits. More particularly, some embodiments of the invention provide systems and methods for low current detection. Merely by way of example, certain embodiments of the invention have been applied to charging and/or discharging of batteries. But it would be recognized that the invention has a much broader range of applicability.

Figure 1:
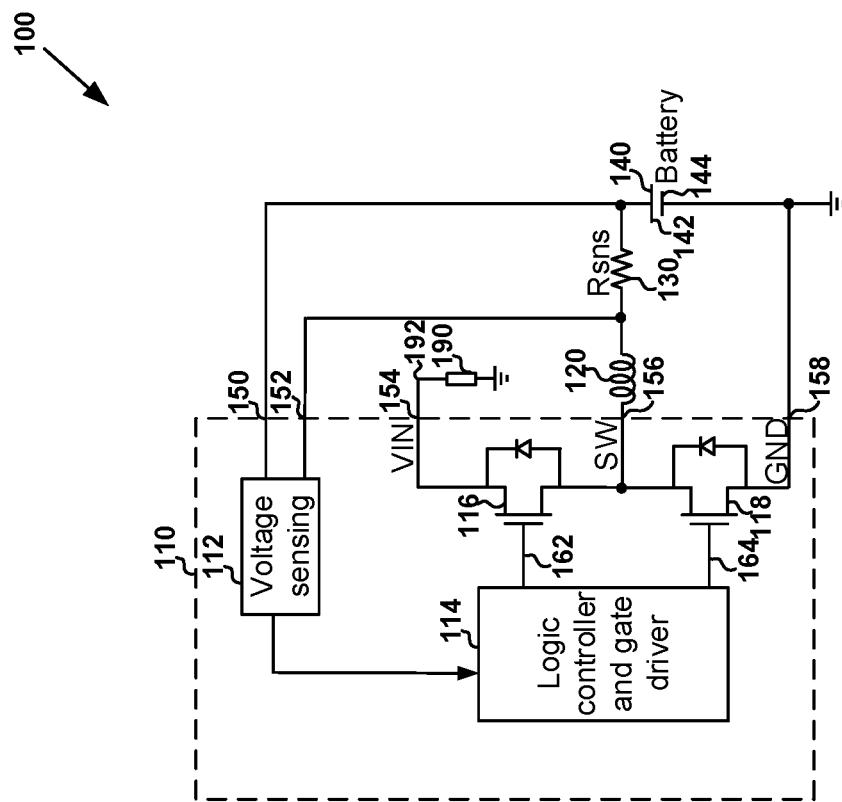
FIG. 1 is a simplified diagram showing a conventional battery charging system.

Referring to FIG. 1, the battery management system 110 (e.g., a chip) uses the resistor 130 to detect a charging current of the battery 140. Such configuration often increases the complexity of the circuit design and the area of the chip. Additionally, the resistor 130 that is external to the chip 110 usually increases the total system cost for the bill of material (BOM) and also reduces the power transfer efficiency of the battery charging system 100.

Figure 2:
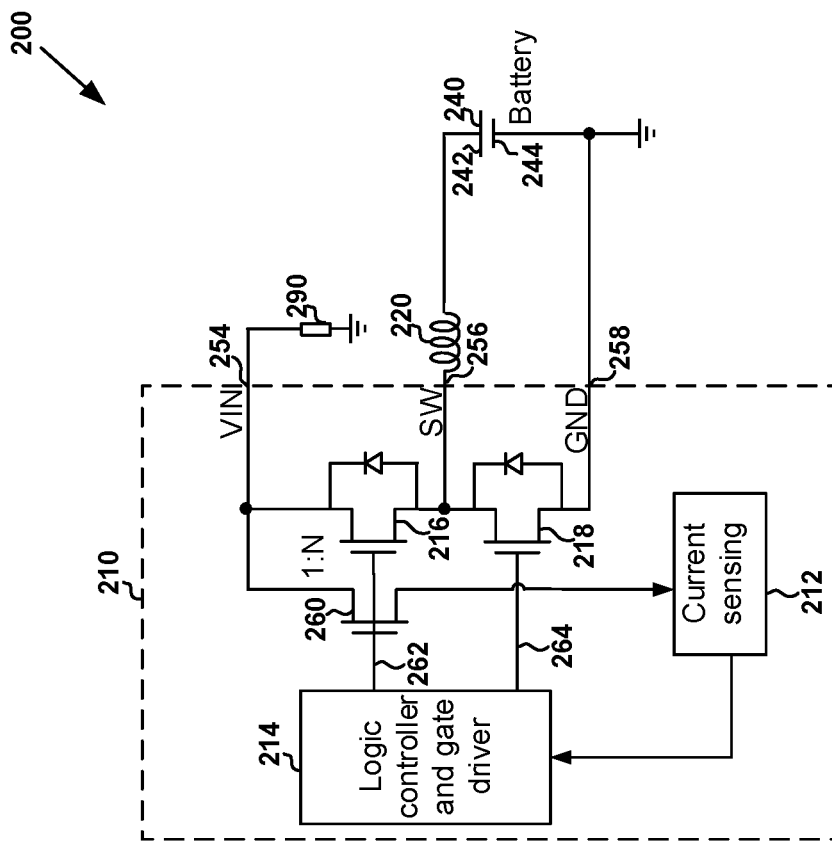
FIG. 2 is a simplified diagram showing another conventional battery charging system.

Referring to FIG. 2, the battery management system 210 (e.g., a chip) uses the sense transistor 260 (e.g., a field-effect transistor) to detect a charging current of the battery 240. As mentioned above, the current flowing through the transistor 260 is equal to the current flowing through the transistor 216 divided by N, and N often is selected to be a large integer (e.g., an integer ranging from 1,000 to 10,000). Such a large ratio N usually does not result in good accuracy in semiconductor device matching. Additionally, when the charging current of the battery 240 becomes close to the exit threshold current in magnitude, the voltage difference between the terminal 254 (e.g., the VIN terminal) and the terminal 256 (e.g., the SW terminal) becomes very small, usually at the mV level. Moreover, the offset of the sampling circuit related to the sense transistor 260 usually is in tens of mV, which can cause additional detection error. Also, when the transistor 216 operates in the high-frequency switching mode, the switching delay reduces the detection accuracy. Often, the battery charging system 200 suffers from low detection accuracy.

Figure 3:
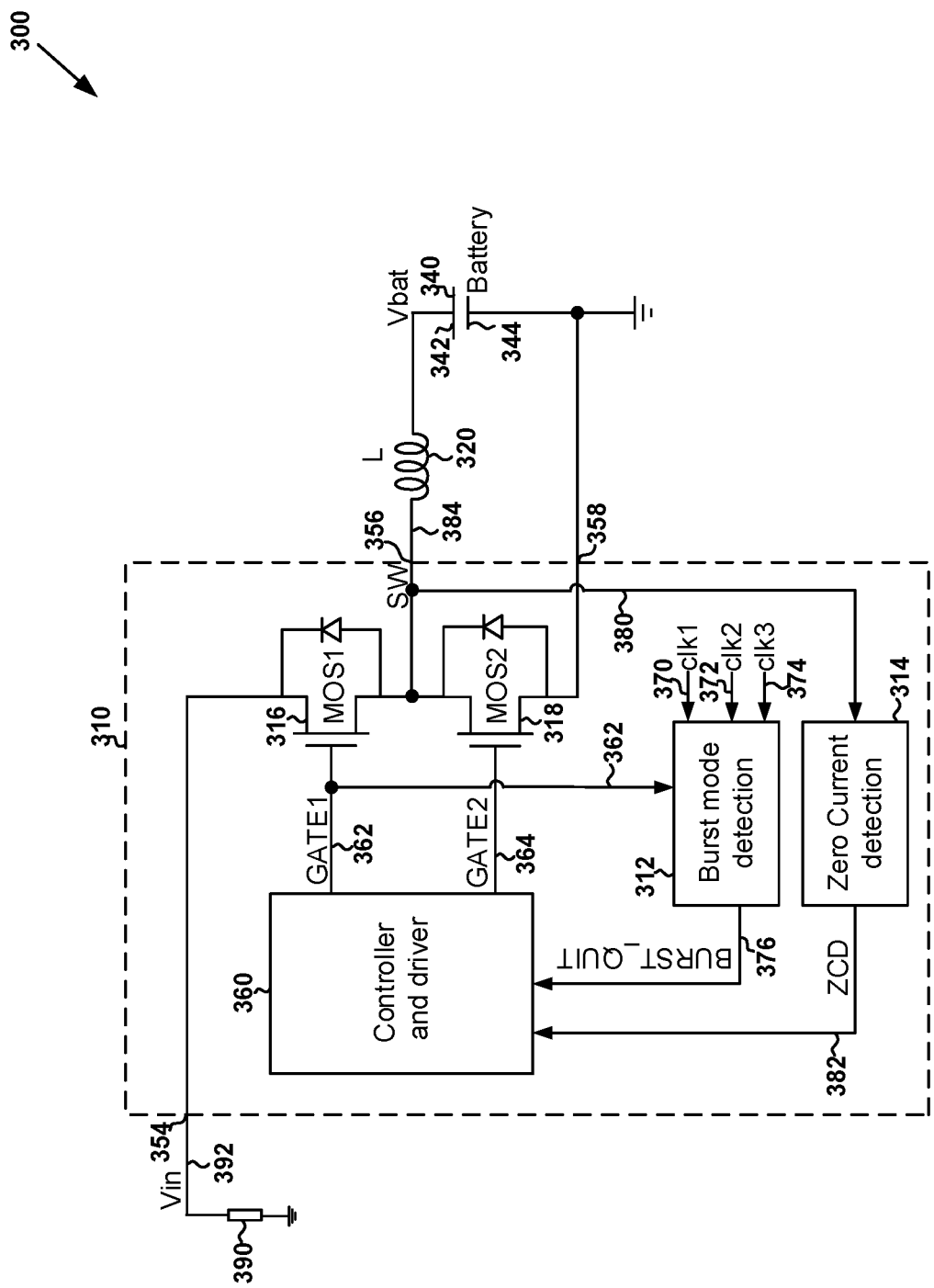
FIG. 3 is a simplified diagram showing a battery charging system according to some embodiments of the present invention.

FIG. 3 is a simplified diagram showing a battery charging system according to some embodiments of the present invention. This diagram is merely an example, which should not unduly limit the scope of the claims. One of ordinary skill in the art would recognize many variations, alternatives, and modifications. The battery charging system 300 includes a battery management system 310, an inductor 320, a battery 340, and a power supply 390. The battery management system 310 (e.g., a chip) includes terminals 354, 356 and 358 (e.g., pins). Additionally, the battery management system 310 (e.g., a chip) includes a burst-mode detection circuit 312, a zero-current detection circuit 314, a controller and driver 360, and transistors 316 and 318. For example, each of the transistors 316 and 318 includes a drain terminal, a gate terminal, and a source terminal. As an example, the battery 340 includes a terminal 342 connected to the inductor 320, and the battery 340 also includes a terminal 344 connected to the terminal 358 and biased to a ground voltage.

In some examples, the controller and driver 360 (e.g., a pulse-width-modulation controller and gate driver) generates a gate drive signal 362, which is received by the transistor 316, and the controller and driver 360 (e.g., a pulse-width-modulation controller and gate driver) also generates a gate drive signal 364, which is received by the transistor 318. In certain examples, the power supply 390 provides an input voltage 392 to the terminal 354, and the battery 340 (e.g., a lithium-ion battery) is charged between the terminals 356 and 358 through at least the inductor 320. For example, each of the transistors 316 and 318 is an NMOS transistor. As an example, the drain terminal of the transistor 316 receives the input voltage 392 from the power supply 390 through the terminal 354.

As shown in FIG. 3, the battery management system 310 and the inductor 320 are used to charge the battery 340 by the power supply 390, which provides an input voltage to the terminal 354 according to some embodiments. For example, the battery management system 310 can detect whether the charging current of the battery 340 falls below a predetermined threshold (e.g., an exit threshold current). As an example, the controller and driver 360 (e.g., a pulse-width-modulation controller and gate driver), in response to the state of the battery 340, outputs the gate drive signal 362 to the transistor 316 in order to turn on or turn off the transistor 316 and outputs the gate drive signals 364 to the transistor 318 in order to turn on or turn off the transistor 318, so as to control the charging of the battery 340.

In some embodiments, the burst-mode detection circuit 312 receives the gate drive signal 362 and also clock signals 370, 372 and 374. For example, the burst-mode detection circuit 312 uses the gate drive signal 362 to determine whether the battery management system 310 operates under the burst mode, and uses the clock signals 370, 372 and 374 to determine certain timing parameters related to the burst mode. As an example, the clock signal 370 has a period that is equal to the time duration of a switching cycle. For example, the burst-mode detection circuit 312 generates a detection signal 376 based on at least the gate drive signal 362 and the clock signals 370, 372 and 374, and outputs the detection signal 376 to the controller and driver 360.

In certain embodiments, the zero-current detection circuit 314 is connected to the terminal 356 and receives a voltage 380. For example, the zero-current detection circuit 314 uses the voltage 380 to determine whether a current 384 flowing through the inductor 320 reduces to zero when the battery management system 310 operates under the continuous conduction mode, and outputs a detection signal 382 to the controller and driver 360. As an example, if the zero-current detection circuit 314 determines that the current 384 flowing through the inductor 320 reduces to zero when the battery management system 310 operates under the continuous conduction mode, the zero-current detection circuit 314 outputs the detection signal 382 to the controller and driver 360 in order to turn off the transistor 318.

As discussed above and further emphasized here, FIG. 3 is merely an example, which should not unduly limit the scope of the claims. One of ordinary skill in the art would recognize many variations, alternatives, and modifications. For example, the battery 340 is replaced by multiple batteries, and the multiple batteries include one battery terminal connected to the inductor 320 and another battery terminal coupled to the terminal 358 and biased to a ground voltage.

Figure 4:
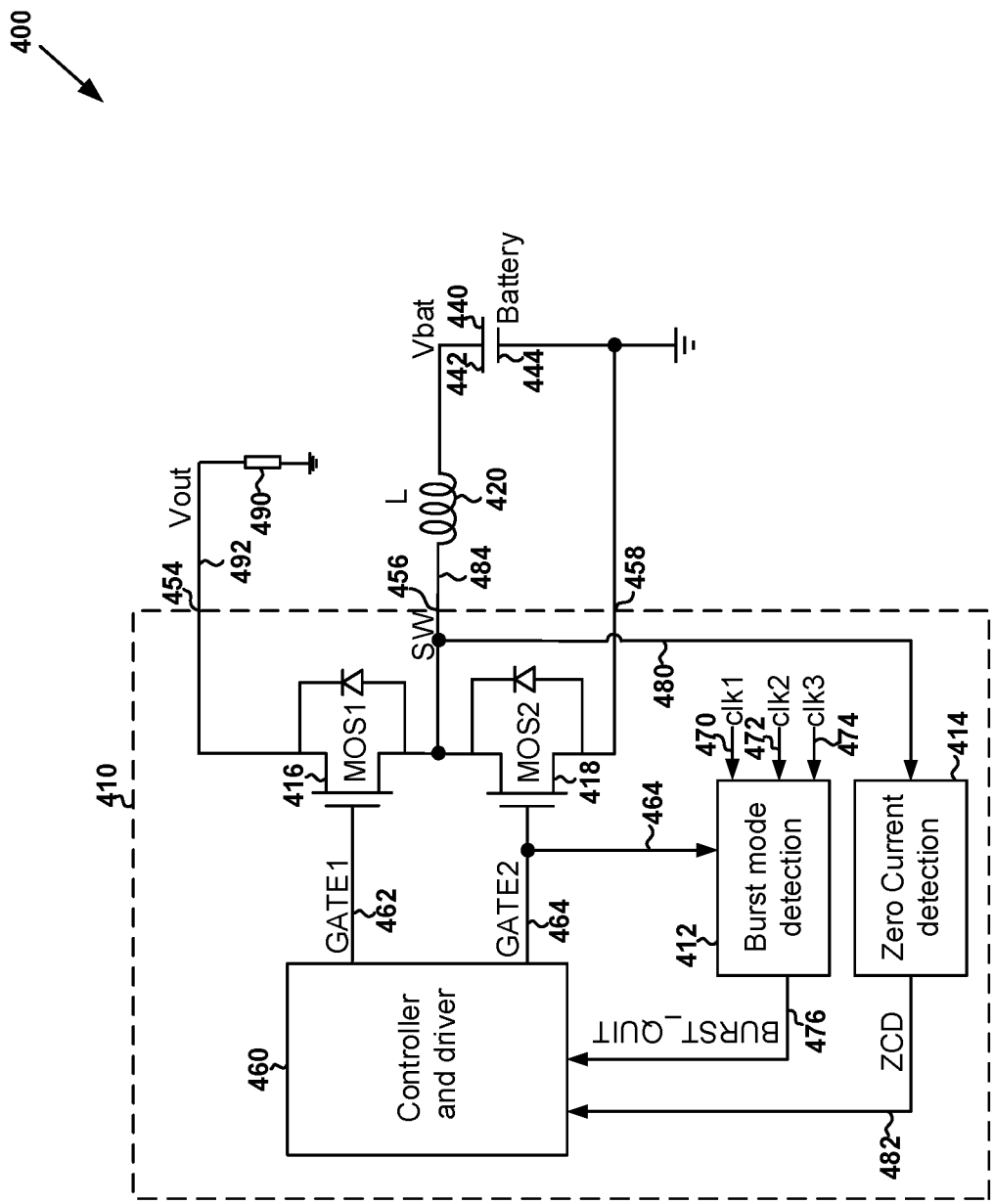
FIG. 4 is a simplified diagram showing a battery discharging system according to some embodiments of the present invention.

FIG. 4 is a simplified diagram showing a battery discharging system according to some embodiments of the present invention. This diagram is merely an example, which should not unduly limit the scope of the claims. One of ordinary skill in the art would recognize many variations, alternatives, and modifications. The battery discharging system 400 includes a battery management system 410, an inductor 420, a battery 440, and a load 490. The battery management system 410 (e.g., a chip) includes terminals 454, 456 and 458 (e.g., pins). Additionally, the battery management system 410 (e.g., a chip) includes a burst-mode detection circuit 412, a zero-current detection circuit 414, a controller and driver 460, and transistors 416 and 418. For example, each of the transistors 416 and 418 includes a drain terminal, a gate terminal, and a source terminal. As an example, the battery 440 includes a terminal 442 connected to the inductor 420, and the battery 440 also includes a terminal 444 connected to the terminal 458 and biased to a ground voltage.

In some examples, the controller and driver 460 (e.g., a pulse-width-modulation controller and gate driver) generates a gate drive signal 462, which is received by the transistor 416, and the controller and driver 460 (e.g., a pulse-width-modulation controller and gate driver) also generates a gate drive signal 464, which is received by the transistor 418. In certain examples, the load 490 (e.g., a mobile phone) receives an output voltage 492 from the terminal 454, and the battery 440 (e.g., a lithium-ion battery) is discharged between the terminals 456 and 458 through at least the inductor 420. For example, each of the transistors 416 and 418 is an NMOS transistor. As an example, the drain terminal of the transistor 416 provides the output voltage 492 to the load 490 through the terminal 454.

As shown in FIG. 4, the battery management system 410 and the inductor 420 are used to discharge the battery 440 by the load 490, which receives an output voltage from the terminal 454 according to certain embodiments. For example, the battery management system 410 can detect whether the discharging current of the battery 440 falls below a predetermined threshold (e.g., an exit threshold current). As an example, the controller and driver 460 (e.g., a pulse-width-modulation controller and gate driver), in response to the state of the battery 440, outputs the gate drive signal 462 to the transistor 416 in order to turn on or turn off the transistor 416 and outputs the gate drive signals 464 to the transistor 418 in order to turn on or turn off the transistor 418, so as to control the discharging of the battery 440.

In some embodiments, the burst-mode detection circuit 412 receives the gate drive signal 464 and also clock signals 470, 472 and 474. For example, the burst-mode detection circuit 412 uses the gate drive signal 464 to determine whether the battery management system 310 operates under the burst mode, and uses the clock signals 470, 472 and 474 to determine certain timing parameters related to the burst mode. As an example, the clock signal 470 has a period that is equal to the time duration of a switching cycle. For example, the burst-mode detection circuit 412 generates a detection signal 476 based on at least the gate drive signal 464 and the clock signals 470, 472 and 474, and outputs the detection signal 476 to the controller and driver 460.

In certain embodiments, the zero-current detection circuit 414 is connected to the terminal 456 and receives a voltage 480. For example, the zero-current detection circuit 414 uses the voltage 480 to determine whether a current 484 flowing through the inductor 420 reduces to zero when the battery management system 410 operates under the continuous conduction mode, and outputs a detection signal 482 to the controller and driver 460. As an example, if the zero-current detection circuit 414 determines that the current 484 flowing through the inductor 420 reduces to zero when the battery management system 410 operates under the continuous conduction mode, the zero-current detection circuit 414 outputs the detection signal 482 to the controller and driver 460 in order to turn off the transistor 416.

As discussed above and further emphasized here, FIG. 4 is merely an example, which should not unduly limit the scope of the claims. One of ordinary skill in the art would recognize many variations, alternatives, and modifications. For example, the battery 440 is replaced by multiple batteries, and the multiple batteries include one battery terminal connected to the inductor 420 and another battery terminal coupled to the terminal 458 and biased to a ground voltage.

Figure 5:
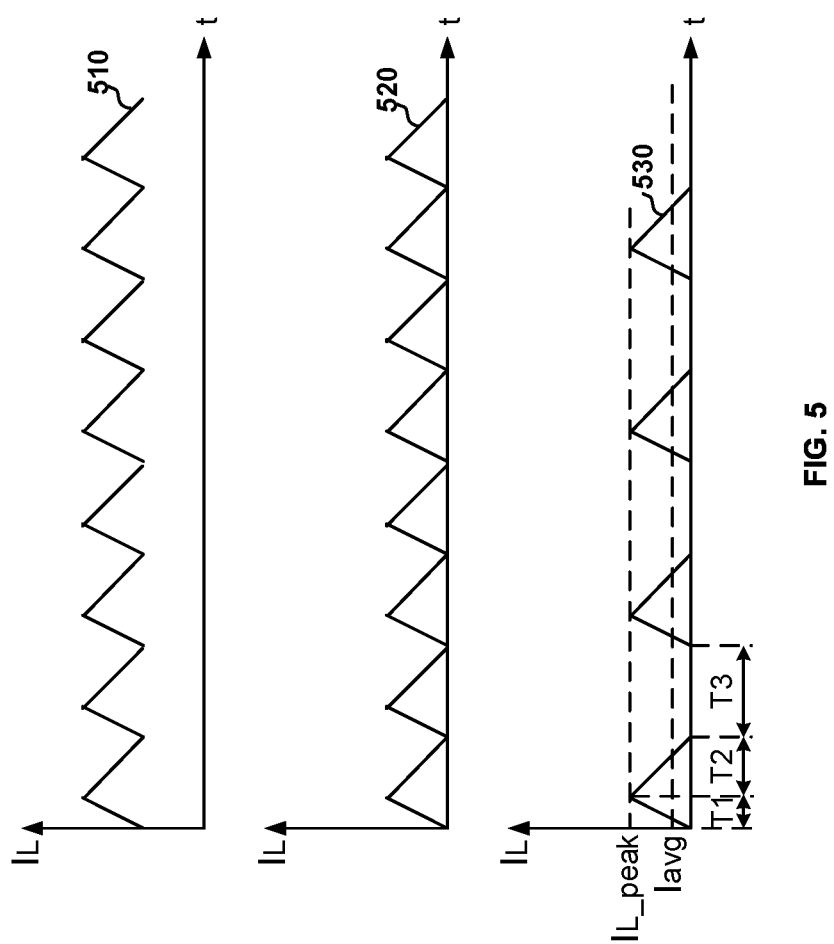
FIG. 5 is a simplified diagram showing various modes of operation for the battery charging system as shown in FIG. 3 and the battery discharging system as shown in FIG. 4 according to some embodiments of the present invention.

FIG. 5 is a simplified diagram showing various modes of operation for the battery charging system 300 and the battery discharging system 400 according to some embodiments of the present invention. This diagram is merely an example, which should not unduly limit the scope of the claims. One of ordinary skill in the art would recognize many variations, alternatives, and modifications. The curve 510 represents an inductor current as a function of time for continuous conduction mode of the battery charging system 300 and the battery discharging system 400, the curve 520 represents the inductor current as a function of time for discontinuous conduction mode of the battery charging system 300 and the battery discharging system 400, and the curve 530 represents the inductor current as a function of time for burst mode of the battery charging system 300 and the battery discharging system 400.

In some examples, for the battery charging system 300, when the charging current of the battery 340 becomes smaller and smaller on average, the inductor current (e.g., the current 384) gradually changes from the continuous conduction mode to the discontinuous mode, and then gradually changes from the discontinuous mode to the burst mode. In certain examples, for the battery discharging system 400, when the discharging current of the battery 440 becomes smaller and smaller on average, the inductor current (e.g., the current 484) gradually changes from the continuous conduction mode to the discontinuous mode, and then gradually changes from the discontinuous mode to the burst mode.

As shown by the curve 510 the inductor current (e.g., the current 384 and/or the current 484) remains larger than zero in magnitude under the continuous conductor mode according to certain embodiments. As shown by the curve 520, the inductor current (e.g., the current 384 and/or the current 484) drops to zero in magnitude under the discontinuous conductor mode according to some embodiments. As shown by the curve 530, the inductor current (e.g., the current 384 and/or the current 484) not only drops to zero in magnitude but also skip one or more switching cycles under the burst mode according to certain embodiments.

In some embodiments, as shown by the curve 530, during the time duration $T_1$, the inductor current (e.g., the current 384 and/or the current 484)) increases from zero to a peak magnitude (e.g., $I_{L\_peak}$). For example, the transistor 316 of the battery charging system 300 is turned on and the transistor 318 of the battery charging system 300 is turned off during the time duration $T_1$, and the time duration $T_1$ represents the turn-on time of the transistor 316 and the turn-off time of the transistor 318. As an example, the transistor 416 of the battery discharging system 400 is turned off and the transistor 418 of the battery discharging system 400 is turned on during the time duration $T_1$, and the time duration $T_1$ represents the turn-off time of the transistor 416 and the turn-on time of the transistor 418.

In certain embodiments, as shown by the curve 530, during the time duration $T_2$, the inductor current (e.g., the current 384 and/or the current 484) decreases from the peak magnitude (e.g., $I_{L\_peak}$) to zero. For example, the transistor 316 of the battery charging system 300 is turned off and the transistor 318 of the battery charging system 300 is turned on during the time duration $T_2$, and the time duration $T_2$ represents the turn-off time of the transistor 316 and the turn-on time of the transistor 318. As an example, the transistor 416 of the battery discharging system 400 is turned on and the transistor 418 of the battery discharging system 400 is turned off during the time duration $T_2$, and the time duration $T_2$ represents the turn-on time of the transistor 416 and the turn-off time of the transistor 418.

In some examples, as shown in 3, if the current 384 decreases to zero, the zero-current detection circuit 314 outputs the detection signal 382 to the controller and driver 360 in order to turn off the transistor 318 so that both of the transistors 316 and 318 are turned off and the current 384 remains equal to zero. In certain examples, as shown in FIG. 4, if the current 484 decreases to zero, the zero-current detection circuit 414 outputs the detection signal 482 to the controller and driver 460 in order to turn off the transistor 416 so that both of the transistors 416 and 418 are turned off and the current 484 remains equal to zero.

In certain embodiments, as shown by the curve 530, during the time duration $T_3$, the inductor current (e.g., the current 384 and/or the current 484) remains equal to zero in magnitude. For example, both the transistors 316 and 318 of the battery charging system 300 are turned off during the time duration $T_3$. As an example, both the transistors 416 and 418 of the battery discharging system 400 are turned off during the time duration $T_3$. For example, the curve 530 shows a pattern of burst mode that includes one cycle with a pulse and one cycle without any pulse.

According to some embodiments, referring to FIG. 3, within the time duration $T_1$, the inductor current 384 increases from zero to the peak magnitude as follows:

$$I_{L\_peak} = \frac{V_{in} - V_{bat}}{L} \times T_1 \quad \text{(Equation 1)}$$

where $I_{L\_peak}$ represents the peak magnitude of the inductor current 384, $V_{in}$ represents the input voltage provided by the power supply 390 at the terminal 354, and $V_{bat}$ represents the battery voltage of the battery 340.

According to certain embodiments, referring to FIG. 3, within the time duration $T_2$, the inductor current 384 decreases from the peak magnitude to zero as follows:

$$T_2 = \frac{I_{L\_peak} \times L}{V_{bat}} \quad \text{(Equation 2)}$$

where $I_{L\_peak}$ represents the peak magnitude of the inductor current 384, L represents the inductance of the inductor 320, and $V_{bat}$ represents the battery voltage of the battery 340. For example, the rate of decrease for the inductor current 384 is equal to $V_{bat}/L$.

In some embodiments, referring to FIG. 3, the average magnitude of the inductor current 384 is as follows:

$$I_{avg} = \frac{(T_1 + T_2) \times I_{L\_peak}}{2 \times (T_1 + T_2 + T_3)} \quad \text{(Equation 3A)}$$

where $I_{avg}$ represents the average magnitude of the inductor current 384, and $I_{L\_peak}$ represents the peak magnitude of the inductor current 384.

In certain embodiments, referring to FIG. 4, the average magnitude of the inductor current 484 is as follows:

$$I_{avg} = \frac{(T_1 + T_2) \times I_{L\_peak}}{2 \times (T_1 + T_2 + T_3)} \quad \text{(Equation 3B)}$$

where $I_{avg}$ represents the average magnitude of the inductor current 484, and $I_{L\_peak}$ represents the peak magnitude of the inductor current 484.

As mentioned above and further emphasized here, FIG. 5 is merely an example, which should not unduly limit the scope of the claims. One of ordinary skill in the art would recognize many variations, alternatives, and modifications. For example, the curve 530 is modified to represent another pattern of burst mode that includes N continuous cycles each with a pulse and M skipped cycles each without any pulse, where N is a positive integer and M is a positive integer.

Figure 6:
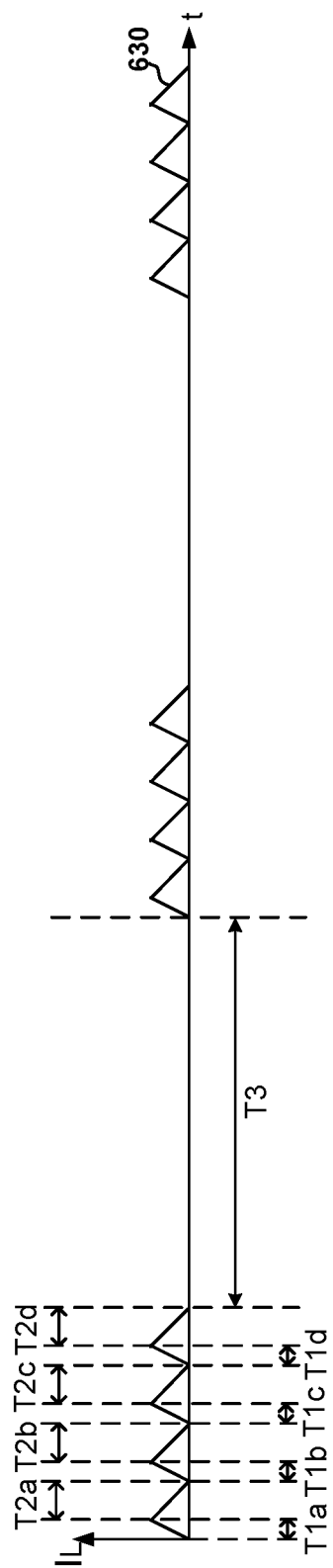
FIG. 6 is a simplified diagram showing a pattern of burst mode of operation for the battery charging system as shown in FIG. 3 and the battery discharging system as shown in FIG. 4 according to some embodiments of the present invention.

FIG. 6 is a simplified diagram showing a pattern of burst mode of operation for the battery charging system 300 and the battery discharging system 400 according to some embodiments of the present invention. This diagram is merely an example, which should not unduly limit the scope of the claims. One of ordinary skill in the art would recognize many variations, alternatives, and modifications. The curve 630 represents the inductor current as a function of time for burst mode of the battery charging system 300 and the battery discharging system 400. As an example, the curve 630 represents a pattern of burst mode that includes four continuous cycles each with a pulse and six skipped cycles each without any pulse.

In some embodiments, referring to FIG. 3, the average magnitude of the inductor current 384 is as follows:

$$I_{avg} = \frac{(T_1 + T_2) \times I_{L\_peak}}{2 \times (T_1 + T_2 + T_3)} \quad \text{(Equation 4A)}$$

where $I_{avg}$ represents the average magnitude of the inductor current 384, and $I_{L\_peak}$ represents the peak magnitude of the inductor current 384. Additionally, $T_1$ represents the total turn-on time of the transistor 316 and the total turn-off time of the transistor 318 during the four continuous cycles each with a pulse, $T_2$ represents the total turn-off time of the transistor 316 and the total turn-on time of the transistor 318 during the four continuous cycles each with a pulse, and $T_3$ represents the total time of the six skipped cycles each without any pulse.

For example, as shown in FIG. 6, $T_1$ is determined as follows:

$$T_1 = T_{1a} + T_{1b} + T_{1c} + T_{1d} \quad \text{(Equation 5A)}$$

where $T_{1a}$, $T_{1b}$, $T_{1c}$, and $T_{1d}$ each represent the turn-on time of the transistor 316 and the turn-off time of the transistor 318 during the corresponding cycle of the four continuous cycles each with a pulse.

As an example, as shown in FIG. 6, $T_2$ is determined as follows:

$$T_2 = T_{2a} + T_{2b} + T_{2c} + T_{2d} \quad \text{(Equation 6A)}$$

where $T_{2a}$, $T_{2b}$, $T_{2c}$, and $T_{2d}$ each represent the turn-off time of the transistor 316 and the turn-on time of the transistor 318 during the corresponding cycle of the four continuous cycles each with a pulse.

In some embodiments, referring to FIG. 4, the average magnitude of the inductor current 484 is as follows:

$$I_{avg} = \frac{(T_1 + T_2) \times I_{L\_peak}}{2 \times (T_1 + T_2 + T_3)} \quad \text{(Equation 4B)}$$

where $I_{avg}$ represents the average magnitude of the inductor current 484, and $I_{L\_peak}$ represents the peak magnitude of the inductor current 484. Additionally, $T_1$ represents the total turn-off time of the transistor 416 and the total turn-on time of the transistor 418 during the four continuous cycles each with a pulse, $T_2$ represents the total turn-on time of the transistor 416 and the total turn-off time of the transistor 418 during the four continuous cycles each with a pulse, and $T_3$ represents the total time of the six skipped cycles each without any pulse.

For example, as shown in FIG. 6, $T_1$ is determined as follows:

$$T_1 = T_{1a} + T_{1b} + T_{1c} + T_{1d} \quad \text{(Equation 5B)}$$

where $T_{1a}$, $T_{1b}$, $T_{1c}$, and $T_{1d}$ each represent the turn-off time of the transistor 416 and the turn-on time of the transistor 418 during the corresponding cycle of the four continuous cycles each with a pulse.

As an example, as shown in FIG. 6, $T_2$ is determined as follows:

$$T_2 = T_{2a} + T_{2b} + T_{2c} + T_{2d} \quad \text{(Equation 6B)}$$

where $T_{2a}$, $T_{2b}$, $T_{2c}$, and $T_{2d}$ each represent the turn-on time of the transistor 416 and the turn-off time of the transistor 418 during the corresponding cycle of the four continuous cycles each with a pulse.

According to some embodiments, as shown in FIG. 3, the charging current of the battery 340 is equal to the inductor current 384. In certain examples, if the average magnitude of the inductor current 384 (e.g., as shown in Equation 3A and/or Equation 4A) becomes smaller than a predetermined threshold (e.g., an exit threshold current), the burst-mode detection circuit 312 changes the detection signal 376 from a logic low level to a logic high level. In some examples, the controller and driver 360 receives the detection signal 376. As an example, in response to the detection signal 376 changing from the logic low level to the logic high level, the controller and driver 360 terminates the modulation of the gate drive signals 362 and 364 by keeping the gate drive signals 362 and 364 at a logic low level so that the transistors 316 and 318 remain turned off. In certain examples, the controller and driver 360 restarts the modulation of the gate drive signals 362 and 364 by one or more automatic actions and/or one or more manual actions. For example, if the average magnitude of the inductor current 384 (e.g., as shown in Equation 3A and/or Equation 4A) becomes larger than the predetermined threshold (e.g., the exit threshold current), the controller and driver 360 automatically restarts the modulation of the gate drive signals 362 and 364.

According to certain embodiments, as shown by Equation 3A and/or Equation 4A, the average magnitude of the inductor current 384 is related to the peak magnitude $I_{L\_peak}$ of the inductor current 384, the time duration $T_1$, the time duration $T_2$, the time duration $T_3$. In some examples, according to Equation 1, the peak magnitude $I_{L\_peak}$ of the inductor current 384 is related to the input voltage $V_{in}$ provided by the power supply 390 at the terminal 354, the battery voltage $V_{bat}$ of the battery 340, and the time duration $T_1$, so the average magnitude of the inductor current 384 is related to the input voltage $V_{in}$ provided by the power supply 390 at the terminal 354, the battery voltage $V_{bat}$ of the battery 340, the time duration $T_1$, the time duration $T_2$, the time duration $T_3$. In certain examples, the input voltage $V_{in}$ provided by the power supply 390 at the terminal 354 and the battery voltage $V_{bat}$ of the battery 340 are predetermined by the application specification, and the time duration $T_1$, which in the burst mode is equal to the minimum turn-on time of the transistor 316, is also predetermined by the application specification. As an example, by detecting the time duration $T_2$ and the time duration $T_3$, the burst-mode detection circuit 312 is configured to determine whether the average magnitude of the inductor current 384 becomes smaller than a predetermined threshold (e.g., an exit threshold current), and if the average magnitude of the inductor current 384 becomes smaller than the predetermined threshold (e.g., the exit threshold current), to change the detection signal 376 from a logic low level to a logic high level.

In some embodiments, as shown in FIG. 4, the discharging current of the battery 440 is equal to the inductor current 484. In certain examples, if the average magnitude of the inductor current 484 (e.g., as shown in Equation 3B and/or Equation 4B) becomes smaller than a predetermined threshold (e.g., an exit threshold current), the burst-mode detection circuit 412 changes the detection signal 476 from a logic low level to a logic high level. As an example, in response to the detection signal 476 changing from the logic low level to the logic high level, the controller and driver 460 terminates the modulation of the gate drive signals 462 and 464 by keeping the gate drive signals 462 and 464 at a logic low level so that the transistors 416 and 418 remain turned off. In certain examples, the controller and driver 460 restarts the modulation of the gate drive signals 462 and 464 by one or more automatic actions and/or one or more manual actions. For example, if the average magnitude of the inductor current 484 (e.g., as shown in Equation 3B and/or Equation 4B) becomes larger than the predetermined threshold (e.g., the exit threshold current), the controller and driver 460 automatically restarts the modulation of the gate drive signals 462 and 464.

In certain embodiments, as shown by Equation 3B and/or Equation 4B, the average magnitude of the inductor current 484 is related to the peak magnitude $I_{L\_peak}$ of the inductor current 484, the time duration $T_1$, the time duration $T_2$, the time duration $T_3$. In some examples, the peak magnitude $I_{L\_peak}$ of the inductor current 484 is related to the output voltage $V_{out}$ received by the load 490 at the terminal 454, the battery voltage $V_{bat}$ of the battery 440, and the time duration $T_1$, so the average magnitude of the inductor current 484 is related to the output voltage $V_{out}$ received by the load 490 at the terminal 454, the battery voltage $V_{bat}$ of the battery 440, the time duration $T_1$, the time duration $T_2$, the time duration $T_3$. In certain examples, the output voltage Vou received by the load 490 at the terminal 454 and the battery voltage $V_{bat}$ of the battery 440 are predetermined by the application specification, and the time duration $T_1$, which in the burst mode is equal to the minimum turn-on time of the transistor 418, is also predetermined by the application specification. As an example, by detecting the time duration $T_2$ and the time duration $T_3$, the burst-mode detection circuit 412 is configured to determine whether the average magnitude of the inductor current 484 becomes smaller than a predetermined threshold (e.g., an exit threshold current), and if the average magnitude of the inductor current 484 becomes smaller than the predetermined threshold (e.g., the exit threshold current), to change the detection signal 476 from a logic low level to a logic high level.

Figure 7:
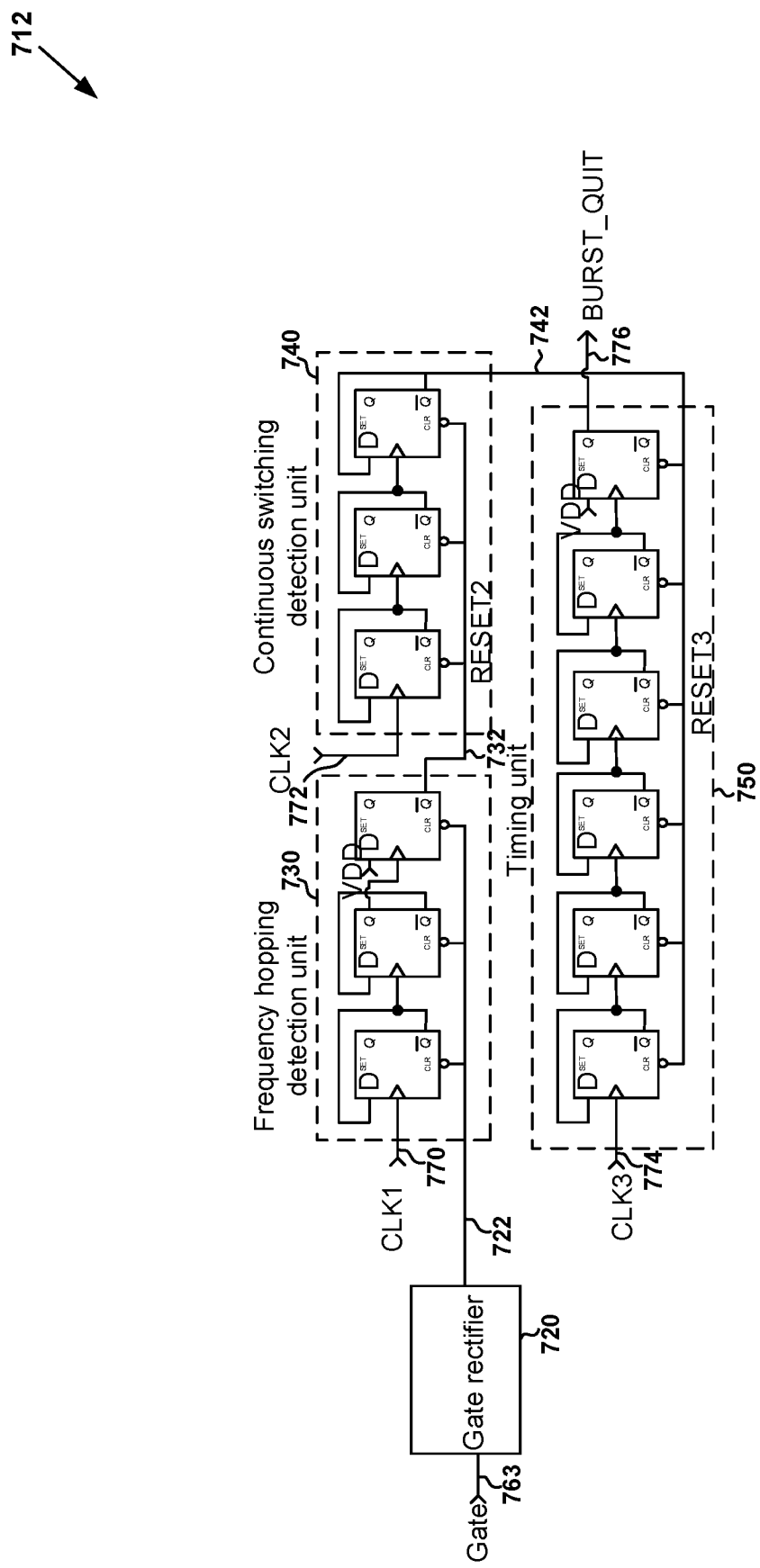
FIG. 7 is a simplified diagram showing a burst-mode detection circuit as part of the battery charging system as shown in FIG. 3 and/or the battery discharging system as shown in FIG. 4 according to some embodiments of the present invention.

FIG. 7 is a simplified diagram showing a burst-mode detection circuit as part of the battery charging system 300 and/or the battery discharging system 400 according to some embodiments of the present invention. This diagram is merely an example, which should not unduly limit the scope of the claims. One of ordinary skill in the art would recognize many variations, alternatives, and modifications. The burst-mode detection circuit 712 includes a gate rectifier 720, a frequency hopping detection unit 730, a continuous switching detection unit 740, and a timing unit 750.

As shown in FIG. 7, the burst-mode detection circuit 712 receives signals 763, 770, 772 and 774, and outputs a signal 776 according to some embodiments. In some examples, the burst-mode detection circuit 712 is the burst-mode detection circuit 312 of the battery charging system 300. For example, the signal 763 is the gate drive signal 362, the signal 770 is the clock signal 370, the signal 772 is the clock signal 372, the signal 774 is the clock signal 374, and the signal 776 is the detection signal 376. In certain examples, the burst-mode detection circuit 712 is the burst-mode detection circuit 412 of the battery discharging system 400. As an example, the signal 763 is the gate drive signal 464, the signal 770 is the clock signal 470, the signal 772 is the clock signal 472, the signal 774 is the clock signal 474, and the signal 776 is the detection signal 476.

In some embodiments, the gate rectifier 720 receives the signal 763 and outputs a signal 722. For example, if the signal 763 switches between a logic high level and a logic low level, the gate rectifier 720 generates the signal 722 at a logic low level. As an example, if the signal 763 does not switch between a logic high level and a logic low level, the gate rectifier 720 generates the signal 722 at a logic high level. In certain examples, the signal 722 changes from the logic low level to the logic high level, if the signal 763 stopes switching and the frequency hopping occurs in the signal 763. In some examples, the signal 722 changes from the logic high level to the logic low level, if the frequency hopping stops in the signal 763 and the signal 763 starts switching.

In certain embodiments, the frequency hopping detection unit 730 receives the signals 722 and 770 and outputs a signal 732. As an example, one period of the clock signal 770 is equal to the time duration of each switching cycle. In some examples, the frequency hopping detection unit 730 determines whether the signal 722 is at the logic high level, and if the signal 722 is at the logic high level, whether the time duration for the signal 722 to remain at the logic high level is equal to or larger than one period of the clock signal 770 multiplied by a predetermined skipping threshold. In some examples, the predetermined skipping threshold is a positive number. For example, the predetermined skipping threshold is an integer. As an example, the predetermined skipping threshold is not an integer. As an example, if the signal 722 is at the logic low level, or if the time duration for the signal 722 to remain at the logic high level is smaller than one period of the clock signal 770 multiplied by the predetermined skipping threshold, the frequency hopping detection unit 730 generates the signal 732 at a logic high level. For example, if the time duration for the signal 722 to remain at the logic high level is equal to or larger than one period of the clock signal 770 multiplied by the predetermined skipping threshold, the frequency hopping detection unit 730 generates the signal 732 at a logic low level. In certain examples, the time duration of each switching cycle is equal to one period of the clock signal 770. As an example, if the time duration $T_3$ (e.g., as shown in Equation 3A, Equation 3B, Equation 4A, and/or Equation 4B) is larger than or equal to one period of the clock signal 770 multiplied by the predetermined skipping threshold, the frequency hopping detection unit 730 generates the signal 732 at the logic low level.

In some examples, the frequency hopping detection unit 730 processes the signal 722 to determine whether frequency hopping occurs in the signal 763, and if frequency hopping occurs in the signal 763, whether the number of skipped switching cycles is equal to or larger than the predetermined skipping threshold. For example, if frequency hopping does not occur in the signal 763 or if the number of skipped switching cycles is smaller than the predetermined skipping threshold, the frequency hopping detection unit 730 generates the signal 732 at the logic high level. As an example, if the number of skipped switching cycles is equal to or larger than the predetermined skipping threshold, the frequency hopping detection unit 730 generates the signal 732 at the logic low level. In certain examples, the signal 732 changes from the logic low level to the logic high level if the signal 722 changes from the logic high level to the logic low level. As an example, the signal 732 changes from the logic low level to the logic high level if the frequency hopping has stopped in the signal 763 and the signal 763 has started switching between the logic high level and the logic low level.

In some embodiments, the continuous switching detection unit 740 receives the signals 732 and 772 and outputs a signal 742. In certain examples, when the signal 732 changes from the logic low level to the logic high level, the continuous switching detection unit 740 starts measuring the time duration for the signal 732 to remain at the logic high level in terms of the number of continuous switching cycles, and also determines whether the number of continuous switching cycles becomes larger than a predetermined continuous threshold. In some examples, the predetermined continuous threshold is a positive number. For example, the predetermined continuous threshold is an integer. As an example, the predetermined continuous threshold is not an integer. In certain examples, the predetermined continuous threshold is determined by the clock signal 772. For example, if the number of continuous switching cycles does not become larger than the predetermined continuous threshold, the continuous switching detection unit 740 keep the signal 742 at the logic high level. As an example, if the number of continuous switching cycles becomes larger than a predetermined continuous threshold, the continuous switching detection unit 740 changes the signal 742 from the logic high level to the logic low level.

As an example, if the time duration $T_2$ (e.g., as shown in Equation 3A, Equation 3B, Equation 4A, and/or Equation 4B) is equal to or smaller than the predetermined continuous threshold multiplied by the difference of one switching cycle minus the time duration $T_1$ (e.g., the minimum turn-on time of the transistor 316 and/or the minimum turn-on time of the transistor 418). For example, if the time duration $T_2$ (e.g., as shown in Equation 3A, Equation 3B, Equation 4A, and/or Equation 4B) becomes larger than the predetermined continuous threshold multiplied by the difference of one switching cycle minus the time duration $T_1$ (e.g., the minimum turn-on time of the transistor 316 and/or the minimum turn-on time of the transistor 418), the continuous switching detection unit 740 changes the signal 742 from the logic high level to the logic low level.

In certain embodiments, the signal 742 being at the logic high level represents that the time duration $T_2$ (e.g., as shown in Equation 3A, Equation 3B, Equation 4A, and/or Equation 4B) is equal to or smaller than the predetermined continuous threshold multiplied by the difference of the time duration of each switching cycle minus the time duration $T_1$ (e.g., the minimum turn-on time of the transistor 316 and/or the minimum turn-on time of the transistor 418), and that the time duration $T_3$ (e.g., as shown in Equation 3A, Equation 3B, Equation 4A, and/or Equation 4B) is larger than or equal to the time duration of each switching cycle multiplied by the predetermined skipping threshold. For example, the signal 742 being at the logic high level represents that the number of continuous switching cycles is equal to or smaller than the predetermined continuous threshold and that the number of skipped switching cycles is equal to or larger than the predetermined skipping threshold.

In some examples, the signal 742 changes from the logic high level to the logic low level if the number of continuous switching cycles becomes larger than the predetermined continuous threshold and/or that the number of skipped switching cycles becomes smaller than the predetermined skipping threshold. In certain examples, the signal 742 changes from the logic low level to the logic high level if the number of continuous switching cycles is equal to or smaller than the predetermined continuous threshold and that the number of skipped switching cycles is equal to or larger than the predetermined skipping threshold. As an example, the signal 742 remains at the logic high level if the number of continuous switching cycles remains equal to or smaller than the predetermined continuous threshold and that the number of skipped switching cycles remains equal to or larger than the predetermined skipping threshold.

According to some embodiments, the timing unit 750 receives the signals 742 and 774 and outputs the signal 776. In certain examples, when the signal 742 changes from the logic low level to the logic high level, the timing unit 750 starts measuring the time duration for the signal 742 to remain at the logic high level, and also determines whether the time duration becomes larger than a predetermined time threshold. For example, if the time duration for the signal 742 to remain at the logic high level becomes larger than the predetermined time threshold, the timing unit 750 changes the signal 776 from a logic low level to a logic high level. In some examples, the predetermined time threshold is determined by the clock signal 774.

In some examples, the condition is that the number of continuous switching cycles remains equal to or smaller than the predetermined continuous threshold and the number of skipped switching cycles remains equal to or larger than the predetermined skipping threshold, and if this condition remains satisfied for the time duration that is larger than the predetermined time threshold, the timing unit 750 generates the signal 776 at the logic high level. For example, if this condition remains satisfied for the time duration that is larger than the predetermined time threshold, the average magnitude of the inductor current 384 (e.g., as shown in Equation 3A and/or Equation 4A) is smaller than a predetermined threshold (e.g., an exit threshold current). As an example, if this condition remains satisfied for the time duration that is larger than the predetermined time threshold, the average magnitude of the inductor current 484 (e.g., as shown in Equation 3B and/or Equation 4B) is smaller than a predetermined threshold (e.g., an exit threshold current).

In certain embodiments, the signal 776 is the detection signal 376 as shown in FIG. 3. As an example, if the detection signal 376 is at the logic high level, the controller and driver 360 does not modulate the gate drive signals 362 and 364 but instead keeps the gate drive signals 362 and 364 at the logic low level so that the transistors 316 and 318 remain turned off. For example, if the detection signal 376 is at the logic high level, the controller and driver 360 does not modulate the gate drive signals 362 and 364 but instead keeps the gate drive signals 362 and 364 at the logic low level so that the transistors 316 and 318 remain turned off for an off time duration that is longer than the time duration of the skipped switching cycles.

In some embodiments, the signal 776 is the detection signal 476 as shown in FIG. 4. As an example, if the detection signal 476 is at the logic high level, the controller and driver 460 does not modulate the gate drive signals 462 and 464 but instead keeps the gate drive signals 462 and 464 at the logic low level so that the transistors 416 and 418 remain turned off. For example, if the detection signal 476 is at the logic high level, the controller and driver 460 does not modulate the gate drive signals 462 and 464 but instead keeps the gate drive signals 462 and 464 at the logic low level so that the transistors 416 and 418 remain turned off for an off time duration that is longer than the time duration of the skipped switching cycles. Some embodiments of the present invention provide simple and reliable systems and methods for detecting whether a current (e.g., a charging current and/or a discharging current) becomes equal to or smaller than the exit threshold current with high accuracy.

According to certain embodiments, a battery management system (e.g., the battery management system 310 and/or the battery management system 410) for charging or discharging one or more batteries (e.g., the battery 340 and/or the battery 440) includes: a first transistor (e.g., the transistor 316 and/or the transistor 418) including a first transistor terminal, a second transistor terminal, and a third transistor terminal, the second transistor terminal being configured to receive a first drive signal (e.g., the gate drive signal 362 and/or the gate drive signal 464); a second transistor (e.g., the transistor 318 and/or the transistor 416) including a fourth transistor terminal, a fifth transistor terminal, and a sixth transistor terminal, the fifth transistor terminal being configured to receive a second drive signal (e.g., the gate drive signal 364 and/or the gate drive signal 462); a burst mode detector (e.g., the burst-mode detection circuit 312 and/or the burst-mode detection circuit 412) configured to receive the first drive signal and generate a burst-mode detection signal (e.g., the detection signal 376 and/or the detection signal 476) based at least in part on the first drive signal; and a drive signal generator (e.g., the controller and driver 360 and/or the controller and driver 460) configured to receive the burst-mode detection signal and generate the first drive signal and the second drive signal based at least in part on the burst-mode detection signal; wherein: the fourth transistor terminal of the second transistor is connected to the third transistor terminal of the first transistor; and the third transistor terminal and the fourth transistor terminal are coupled to a first battery terminal of one or more batteries (e.g., the terminal 342 of the battery 340 and/or the terminal 442 of the battery 440) through an inductor (e.g., the inductor 320 and/or the inductor 420), the one or more batteries further including a second battery terminal (e.g., the terminal 344 of the battery 340 and/or the terminal 444 of the battery 440); wherein the burst mode detector is further configured to: determine a first number of one or more continuous cycles of the first drive signal (e.g., N continuous cycles each with a pulse, where N being a positive integer), during each cycle of the one or more continuous cycles the first drive signal switching between a first logic level and a second logic level; determine a second number of one or more skipped cycles of the first drive signal (e.g., M skipped cycles each without any pulse, where M being a positive integer), during each cycle of the one or more skipped cycles the first drive signal remaining at the first logic level; determine whether an average magnitude of an inductor current (e.g., the current 384 and/or the current 484) provided by the third transistor terminal and the fourth transistor terminal to the inductor or received by the third transistor terminal and the fourth transistor terminal from the inductor is smaller than a predetermined current threshold based at least in part on the first number of the one or more continuous cycles and the second number of the one or more skipped cycles; and if the average magnitude of the inductor current is smaller than the predetermined current threshold, generate the burst-mode detection signal to cause the drive signal generator to stop first modulation of the first drive signal and stop second modulation of the second drive signal; wherein the drive signal generator is further configured to, if the average magnitude of the inductor current is smaller than the predetermined current threshold, in response to the burst-mode detection signal, stop the first modulation of the first drive signal and the second modulation of the second drive signal so that the first transistor and the second transistor remain turned off. As an example, the battery management system is implemented according to at least FIG. 3 and/or FIG. 4.

In some examples, the first transistor terminal of the first transistor is configured to receive an input voltage (e.g., the input voltage 392) from a power supply (e.g., the power supply 390). In certain examples, the sixth transistor terminal of the second transistor is configured to provide an output voltage (e.g., the output voltage 492) to a load (e.g., the load 490). In some examples, the sixth transistor terminal of the second transistor (e.g., the transistor 318) is coupled to the second battery terminal of the one or more batteries (e.g., the battery 340); and the sixth transistor terminal of the second transistor is biased to a predetermined voltage (e.g., a ground voltage). In certain examples, the first transistor terminal of the first transistor (e.g., the transistor 418) is coupled to the second battery terminal of the one or more batteries (e.g., the battery 440); and the first transistor terminal of the first transistor is biased to a predetermined voltage (e.g., a ground voltage).

In some examples, the battery management system further includes: a zero current detector (e.g., the zero-current detection circuit 314 and/or the zero-current detection circuit 414) configured to receive a voltage signal (e.g., the voltage 380 and/or the voltage 480), determine whether the inductor current is equal to zero based at least in part on the voltage signal, and generate a zero-current detection signal (e.g., the detection signal 382 and/or the detection signal 482) based at least in part on whether the inductor current is determined to be equal to zero or not. In certain examples, the drive signal generator (e.g., the controller and driver 360 and/or the controller and driver 460) is further configured to receive the zero-current detection signal and generate the first drive signal and the second drive signal based at least in part on the burst-mode detection signal and the zero-current detection signal. In some examples, the burst mode detector is further configured to: receive at least one clock signal (e.g., the clock signal 370, the clock signal 372, the clock signal 374, the clock signal 470, the clock signal 472, and/or the clock signal 474); and generate the burst-mode detection signal based at least in part on the first drive signal and the clock signal.

According to certain embodiments, a battery management system (e.g., the battery management system 310 and/or the battery management system 410) for charging or discharging one or more batteries (e.g., the battery 340 and/or the battery 440) includes: a first transistor (e.g., the transistor 316 and/or the transistor 418) including a first transistor terminal, a second transistor terminal, and a third transistor terminal, the second transistor terminal being configured to receive a first drive signal (e.g., the gate drive signal 362 and/or the gate drive signal 464); a burst mode detector (e.g., the burst-mode detection circuit 312 and/or the burst-mode detection circuit 412) configured to receive the first drive signal and generate a burst-mode detection signal (e.g., the detection signal 376 and/or the detection signal 476) based at least in part on the first drive signal; and a drive signal generator (e.g., the controller and driver 360 and/or the controller and driver 460) configured to receive the burst-mode detection signal and generate the first drive signal based at least in part on the burst-mode detection signal; wherein the burst mode detector is further configured to: determine a first number of one or more continuous cycles (e.g., N continuous cycles each with a pulse, where N being a positive integer), during each cycle of the one or more continuous cycles the first drive signal switching between a first logic level and a second logic level; determine a second number of one or more skipped cycles (e.g., M skipped cycles each without any pulse, where M being a positive integer), during each cycle of the one or more skipped cycles the first drive signal remaining at the first logic level; and if the first number being smaller than the predetermined continuous threshold and the second number being larger than the predetermined skipping threshold are both satisfied for a time duration that is larger than a predetermined time threshold, generate the burst-mode detection signal to cause the drive signal generator to stop first modulation of the first drive signal; wherein the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the first modulation of the first drive signal so that the first transistor remains turned off. As an example, the battery management system is implemented according to at least FIG. 3 and/or FIG. 4.

In some examples, wherein the first transistor terminal of the first transistor is configured to receive an input voltage (e.g., the input voltage 392) from a power supply (e.g., the power supply 390). In certain examples, the battery management system further includes: a second transistor (e.g., the transistor 318 and/or the transistor 416) including a fourth transistor terminal, a fifth transistor terminal, and a sixth transistor terminal, the fifth transistor terminal being configured to receive a second drive signal (e.g., the gate drive signal 364 and/or the gate drive signal 462) from the drive signal generator.

In some examples, the fourth transistor terminal of the second transistor is connected to the third transistor terminal of the first transistor; and the third transistor terminal and the fourth transistor terminal are coupled to a first battery terminal of one or more batteries (e.g., the terminal 342 of the battery 340) through an inductor (e.g., the inductor 320), the one or more batteries further including a second battery terminal (e.g., the terminal 344 of the battery 340). In certain examples, the sixth transistor terminal of the second transistor is coupled to the second battery terminal of the one or more batteries; and the sixth transistor terminal of the second transistor is biased to a predetermined voltage (e.g., a ground voltage).

In some examples, the third transistor terminal of the first transistor is coupled to a first battery terminal of one or more batteries (e.g., the terminal 444 of the battery 440), the one or more batteries further including a second battery terminal (e.g., the terminal 442 of the battery 440); and the third transistor terminal of the first transistor is biased to a predetermined voltage (e.g., a ground voltage). In certain examples, the fourth transistor terminal of the second transistor is configured to provide an output voltage (e.g., the output voltage 492) to a load (e.g., the load 490). In some examples, the sixth transistor terminal of the second transistor is connected to the first transistor terminal of the first transistor; and the first transistor terminal and the sixth transistor terminal are coupled to the second battery terminal of the one or more batteries through an inductor (e.g., the inductor 420). In certain examples, the drive signal generator is configured to generate the second drive signal based at least in part on the burst-mode detection signal; the burst mode detector is further configured to, if the first number being smaller than the predetermined continuous threshold and the second number being larger than the predetermined skipping threshold are both satisfied for the time duration that is larger than the predetermined time threshold, generate the burst-mode detection signal to cause the drive signal generator to stop second modulation of the second drive signal; and the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the second modulation of the second drive signal so that the second transistor remains turned off.

In some examples, the battery management system further includes: a zero current detector (e.g., the zero-current detection circuit 314 and/or the zero-current detection circuit 414) configured to receive a voltage signal (e.g., the voltage 380 and/or the voltage 480) and generate a zero-current detection signal (e.g., the detection signal 382 and/or the detection signal 482) based at least in part on the voltage signal; wherein the drive signal generator (e.g., the controller and driver 360 and/or the controller and driver 460) is further configured to receive the zero-current detection signal and generate the first drive signal based at least in part on the burst-mode detection signal and the zero-current detection signal. In certain examples, the burst mode detector is further configured to, if the first number being smaller than the predetermined continuous threshold and the second number being larger than the predetermined skipping threshold are both satisfied for the time duration that is larger than the predetermined time threshold, generate the burst-mode detection signal to cause the drive signal generator to stop the first modulation of the first drive signal for an off time duration that is longer than a skipping time duration corresponding to the one or more skipped cycles; and the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the first modulation of the first drive signal so that the first transistor remains turned off for the off time duration that is longer than the skipping time duration corresponding to the one or more skipped cycles. In some examples, wherein the burst mode detector is further configured to: receive at least one clock signal (e.g., the clock signal 370, the clock signal 372, the clock signal 374, the clock signal 470, the clock signal 472, and/or the clock signal 474); and generate the burst-mode detection signal based at least in part on the first drive signal and the clock signal.

According to some embodiments, a method for charging or discharging one or more batteries includes: receiving the first drive signal; processing information associated with the first drive signal; generating a burst-mode detection signal based at least in part on the first drive signal; receiving the burst-mode detection signal; processing information associated with the burst-mode detection signal; and generating a first drive signal and a second drive signal based at least in part on the burst-mode detection signal; wherein the processing information associated with the first drive signal includes: determining a first number of one or more continuous cycles of the first drive signal (e.g., N continuous cycles each with a pulse, where N being a positive integer), during each cycle of the one or more continuous cycles the first drive signal switching between a first logic level and a second logic level; determining a second number of one or more skipped cycles of the first drive signal (e.g., M skipped cycles each without any pulse, where M being a positive integer), during each cycle of the one or more skipped cycles the first drive signal remaining at the first logic level; and determining whether an average magnitude of an inductor current (e.g., the current 384 and/or the current 484) provided by the third transistor terminal and the fourth transistor terminal to the inductor or received by the third transistor terminal and the fourth transistor terminal from the inductor is smaller than a predetermined current threshold based at least in part on the first number of the one or more continuous cycles and the second number of the one or more skipped cycles; wherein the generating a burst-mode detection signal based at least in part on the first drive signal includes: if the average magnitude of the inductor current is smaller than the predetermined current threshold, generating the burst-mode detection signal to stop first modulation of the first drive signal and stop second modulation of the second drive signal; wherein the generating a first drive signal and a second drive signal based at least in part on the burst-mode detection signal includes: if the average magnitude of the inductor current is smaller than the predetermined current threshold, in response to the burst-mode detection signal, stopping the first modulation of the first drive signal and the second modulation of the second drive signal so that the first transistor and the second transistor remain turned off. As an example, the method is implemented according to at least FIG. 3 and/or FIG. 4.

According to certain embodiments, a method for charging or discharging one or more batteries includes: receiving a first drive signal; processing information associated with the first drive signal; generating a burst-mode detection signal based at least in part on the first drive signal; receiving the burst-mode detection signal; processing information associate with the burst-mode detection signal; and generating the first drive signal based at least in part on the burst-mode detection signal; wherein the processing information associated with the first drive signal includes: determining a first number of one or more continuous cycles, during each cycle of the one or more continuous cycles the first drive signal switching between a first logic level and a second logic level; and determining a second number of one or more skipped cycles, during each cycle of the one or more skipped cycles the first drive signal remaining at the first logic level; wherein the generating a burst-mode detection signal based at least in part on the first drive signal includes: if the first number being smaller than the predetermined continuous threshold and the second number being larger than the predetermined skipping threshold are both satisfied for a time duration that is larger than a predetermined time threshold, generating the burst-mode detection signal to stop first modulation of the first drive signal; wherein the generating the first drive signal based at least in part on the burst-mode detection signal includes: if the first number being smaller than the predetermined continuous threshold and the second number being larger than the predetermined skipping threshold are both satisfied for the time duration that is larger than the predetermined time threshold, in response to the burst-mode detection signal, stopping the first modulation of the first drive signal. As an example, the method is implemented according to at least FIG. 3 and/or FIG. 4.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A battery management system for charging or discharging one or more batteries, the system comprising:
   a first transistor including a first transistor terminal, a second transistor terminal, and a third transistor terminal, the second transistor terminal being configured to receive a first drive signal;
   a second transistor including a fourth transistor terminal, a fifth transistor terminal, and a sixth transistor terminal, the fifth transistor terminal being configured to receive a second drive signal;
   a burst mode detector configured to receive the first drive signal and generate a burst-mode detection signal based at least in part on the first drive signal; and
   a drive signal generator configured to receive the burst-mode detection signal and generate the first drive signal and the second drive signal based at least in part on the burst-mode detection signal;
   wherein:
      the fourth transistor terminal of the second transistor is connected to the third transistor terminal of the first transistor; and
      the third transistor terminal and the fourth transistor terminal are coupled to a first battery terminal of one or more batteries through an inductor, the one or more batteries further including a second battery terminal;
   wherein the burst mode detector is further configured to:
      determine a first number of one or more continuous cycles of the first drive signal, during each cycle of the one or more continuous cycles the first drive signal switching between a first logic level and a second logic level;
      determine a second number of one or more skipped cycles of the first drive signal, during each cycle of the one or more skipped cycles the first drive signal remaining at the first logic level;
      determine whether an average magnitude of an inductor current provided by the third transistor terminal and the fourth transistor terminal to the inductor or received by the third transistor terminal and the fourth transistor terminal from the inductor is smaller than a predetermined current threshold based at least in part on the first number of the one or more continuous cycles and the second number of the one or more skipped cycles; and
      if the average magnitude of the inductor current is smaller than the predetermined current threshold, generate the burst-mode detection signal to cause the drive signal generator to stop a first modulation of the first drive signal and stop a second modulation of the second drive signal;
   wherein the drive signal generator is further configured to, if the average magnitude of the inductor current is smaller than the predetermined current threshold, in response to the burst-mode detection signal, stop the first modulation of the first drive signal and the second modulation of the second drive signal so that the first transistor and the second transistor remain turned off.

2. The battery management system of claim 1 wherein the first transistor terminal of the first transistor is configured to receive an input voltage from a power supply.

3. The battery management system of claim 1 wherein the sixth transistor terminal of the second transistor is configured to provide an output voltage to a load.

4. The battery management system of claim 1 wherein:
the sixth transistor terminal of the second transistor is coupled to the second battery terminal of the one or more batteries; and
the sixth transistor terminal of the second transistor is biased to a predetermined voltage.

5. The battery management system of claim 1 wherein:
the first transistor terminal of the first transistor is coupled to the second battery terminal of the one or more batteries; and
the first transistor terminal of the first transistor is biased to a predetermined voltage.

6. The battery management system of claim 1, and further comprising:
a zero current detector configured to receive a voltage signal, determine whether the inductor current is equal to zero based at least in part on the voltage signal, and generate a zero-current detection signal based at least in part on whether the inductor current is determined to be equal to zero or not.

7. The battery management system of claim 6 wherein the drive signal generator is further configured to receive the zero-current detection signal and generate the first drive signal and the second drive signal based at least in part on the burst-mode detection signal and the zero-current detection signal.

8. The battery management system of claim 1 wherein the burst mode detector is further configured to:
receive at least one clock signal; and
generate the burst-mode detection signal based at least in part on the first drive signal and the clock signal.

9. A battery management system for charging or discharging one or more batteries, the system comprising:
a first transistor including a first transistor terminal, a second transistor terminal, and a third transistor terminal, the second transistor terminal being configured to receive a first drive signal;
a burst mode detector configured to receive the first drive signal and generate a burst-mode detection signal based at least in part on the first drive signal; and
a drive signal generator configured to receive the burst-mode detection signal and generate the first drive signal based at least in part on the burst-mode detection signal;
wherein the burst mode detector is further configured to:
determine a first number of one or more continuous cycles, during each cycle of the one or more continuous cycles the first drive signal switching between a first logic level and a second logic level;
determine a second number of one or more skipped cycles, during each cycle of the one or more skipped cycles the first drive signal remaining at the first logic level; and
if the first number being smaller than a predetermined continuous threshold and the second number being larger than a predetermined skipping threshold are both satisfied for a time duration that is larger than a predetermined time threshold, generate the burst-mode detection signal to cause the drive signal generator to stop a first modulation of the first drive signal;
wherein the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the first modulation of the first drive signal so that the first transistor remains turned off.

10. The battery management system of claim 9 wherein the first transistor terminal of the first transistor is configured to receive an input voltage from a power supply.

11. The battery management system of claim 9, and further comprising:
a second transistor including a fourth transistor terminal, a fifth transistor terminal, and a sixth transistor terminal, the fifth transistor terminal being configured to receive a second drive signal from the drive signal generator.

12. The battery management system of claim 11 wherein:
the fourth transistor terminal of the second transistor is connected to the third transistor terminal of the first transistor; and
the third transistor terminal and the fourth transistor terminal are coupled to a first battery terminal of one or more batteries through an inductor, the one or more batteries further including a second battery terminal.

13. The battery management system of claim 12 wherein:
the sixth transistor terminal of the second transistor is coupled to the second battery terminal of the one or more batteries; and
the sixth transistor terminal of the second transistor is biased to a predetermined voltage.

14. The battery management system of claim 11 wherein:
the third transistor terminal of the first transistor is coupled to a first battery terminal of one or more batteries, the one or more batteries further including a second battery terminal; and
the third transistor terminal of the first transistor is biased to a predetermined voltage.

15. The battery management system of claim 14 wherein the fourth transistor terminal of the second transistor is configured to provide an output voltage to a load.

16. The battery management system of claim 15 wherein:
the sixth transistor terminal of the second transistor is connected to the first transistor terminal of the first transistor; and
the first transistor terminal and the sixth transistor terminal are coupled to the second battery terminal of the one or more batteries through an inductor.

17. The battery management system of claim 11 wherein:
the drive signal generator is configured to generate the second drive signal based at least in part on the burst-mode detection signal;
the burst mode detector is further configured to, if the first number being smaller than the predetermined continuous threshold and the second number being larger than the predetermined skipping threshold are both satisfied for the time duration that is larger than the predetermined time threshold, generate the burst-mode detection signal to cause the drive signal generator to stop a second modulation of the second drive signal; and
the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the second modulation of the second drive signal so that the second transistor remains turned off.

18. The battery management system of claim 9, and further comprising:
a zero current detector configured to receive a voltage signal and generate a zero-current detection signal based at least in part on the voltage signal;
wherein the drive signal generator is further configured to receive the zero-current detection signal and generate the first drive signal based at least in part on the burst-mode detection signal and the zero-current detection signal.

19. The battery management system of claim 9 wherein:
the burst mode detector is further configured to, if the first number being smaller than the predetermined continuous threshold and the second number being larger than the predetermined skipping threshold are both satisfied for the time duration that is larger than the predetermined time threshold, generate the burst-mode detection signal to cause the drive signal generator to stop the first modulation of the first drive signal for an off time duration that is longer than a skipping time duration corresponding to the one or more skipped cycles; and
the drive signal generator is further configured to, if the first number being smaller than the predetermined continuous threshold and the second number being larger than the predetermined skipping threshold are both satisfied for the time duration that is larger than the predetermined time threshold, in response to the burst-mode detection signal, stop the first modulation of the first drive signal so that the first transistor remains turned off for the off time duration that is longer than the skipping time duration corresponding to the one or more skipped cycles.

20. The battery management system of claim 9 wherein the burst mode detector is further configured to:
receive at least one clock signal; and
generate the burst-mode detection signal based at least in part on the first drive signal and the clock signal.

21. A method for charging or discharging one or more batteries, the method comprising:
receiving a first drive signal;
processing information associated with the first drive signal;
generating a burst-mode detection signal based at least in part on the first drive signal;
receiving the burst-mode detection signal;
processing information associated with the burst-mode detection signal; and
generating a first drive signal and a second drive signal based at least in part on the burst-mode detection signal;
wherein the processing information associated with the first drive signal includes:
determining a first number of one or more continuous cycles of the first drive signal, during each cycle of the one or more continuous cycles the first drive signal switching between a first logic level and a second logic level;
determining a second number of one or more skipped cycles of the first drive signal, during each cycle of the one or more skipped cycles the first drive signal remaining at the first logic level; and
determining whether an average magnitude of an inductor current provided by a third transistor terminal and a fourth transistor terminal to an inductor or received by the third transistor terminal and the fourth transistor terminal from the inductor is smaller than a predetermined current threshold based at least in part on the first number of the one or more continuous cycles and the second number of the one or more skipped cycles;
wherein the generating a burst-mode detection signal based at least in part on the first drive signal includes:
if the average magnitude of the inductor current is smaller than the predetermined current threshold, generating the burst-mode detection signal to stop a first modulation of the first drive signal and stop a second modulation of the second drive signal;
wherein the generating a first drive signal and a second drive signal based at least in part on the burst-mode detection signal includes:
if the average magnitude of the inductor current is smaller than the predetermined current threshold, in response to the burst-mode detection signal, stopping the first modulation of the first drive signal and the second modulation of the second drive signal so that the first transistor and the second transistor remain turned off.

22. A method for charging or discharging one or more batteries, the method comprising:
receiving a first drive signal;
processing information associated with the first drive signal;
generating a burst-mode detection signal based at least in part on the first drive signal;
receiving the burst-mode detection signal;
processing information associate with the burst-mode detection signal; and
generating the first drive signal based at least in part on the burst-mode detection signal;
wherein the processing information associated with the first drive signal includes:
determining a first number of one or more continuous cycles, during each cycle of the one or more continuous cycles the first drive signal switching between a first logic level and a second logic level; and
determining a second number of one or more skipped cycles, during each cycle of the one or more skipped cycles the first drive signal remaining at the first logic level;
wherein the generating a burst-mode detection signal based at least in part on the first drive signal includes:
if the first number being smaller than a predetermined continuous threshold and the second number being larger than a predetermined skipping threshold are both satisfied for a time duration that is larger than a predetermined time threshold, generating the burst-mode detection signal to stop a first modulation of the first drive signal;
wherein the generating the first drive signal based at least in part on the burst-mode detection signal includes:
if the first number being smaller than the predetermined continuous threshold and the second number being larger than the predetermined skipping threshold are both satisfied for the time duration that is larger than the predetermined time threshold, in response to the burst-mode detection signal, stopping the first modulation of the first drive signal.

\* \* \* \* \*